US007868417B2

(12) United States Patent  
Ogawa

(10) Patent No.: US 7,868,417 B2
(45) Date of Patent: Jan. 11, 2011

(54) SEMICONDUCTOR DEVICE INCLUDING A PLURALITY OF FUSE ELEMENTS AND ATTENUATION MEMBERS BETWEEN OR AROUND THE PLURALITY OF FUSE ELEMENTS

(75) Inventor: Sumio Ogawa, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 39 days.

(21) Appl. No.: 12/010,548

(22) Filed: Jan. 25, 2008

(65) Prior Publication Data

US 2008/0179708 A1  Jul. 31, 2008

(30) Foreign Application Priority Data

Jan. 26, 2007  (JP)  ............................. 2007-016713

(51) Int. Cl.
*H01L 23/525* (2006.01)
*H01L 21/82* (2006.01)

(52) U.S. Cl. ............................. 257/529; 257/E23.149; 257/E23.15

(58) Field of Classification Search ................ 257/529, 257/E23.149, E23.15; 438/130, 132
See application file for complete search history.

(56) References Cited

U.S. PATENT DOCUMENTS 6,162,686 A * 12/2000 Huang et al. ................. 438/281
6,333,545 B1 12/2001 Ema
6,790,774 B2 9/2004 Fujikawa et al.
6,879,020 B2 * 4/2005 Yamaguchi ................. 257/529
7,397,106 B2 * 7/2008 Tsai et al. ................... 257/529
2004/0245598 A1 12/2004 Yamaguchi
2005/0082635 A1 4/2005 Kang et al.

FOREIGN PATENT DOCUMENTS

| CN | 1574339 A | 2/2005 |
|----|-----------|--------|
| JP | 6-119796 | 4/1994 |
| JP | 7-74254 | 3/1995 |
| JP | 9-17872 A | 1/1997 |
| JP | 9-36234 | 2/1997 |
| JP | 9-69299 | 3/1997 |
| JP | 10-294372 A | 11/1998 |
| JP | 11-163147 A | 6/1999 |
| JP | 2000-68377 A | 3/2000 |
| JP | 2003-501835 | 1/2003 |
| JP | 2005-136060 | 5/2005 |
| WO | WO 00/75987 A1 | 12/2000 |

OTHER PUBLICATIONS

Japanese Office Action dated Feb. 3, 2009 with Partial English-Language Translation.

* cited by examiner

*Primary Examiner*—Anh D Mai
(74) *Attorney, Agent, or Firm*—McGinn IP Law Group, PLLC

(57) ABSTRACT

A semiconductor device includes plural fuse elements which can be disconnected by irradiating a laser beam, and attenuation members which are located between the plural fuse elements as viewed two-dimensionally and can attenuate the laser beam. Each attenuation member includes plural columnar bodies. With this arrangement, the attenuation members including plural columnar units absorb the laser beam leaked out from a fuse element to be disconnected to a semiconductor substrate side. The laser beam is also scattered by Fresnel diffraction. Therefore, the columnar body can efficiently attenuate the laser beam, without generating a crack in the insulation film by absorbing excessive energy.

19 Claims, 13 Drawing Sheets

SEMICONDUCTOR DEVICE INCLUDING A PLURALITY OF FUSE ELEMENTS AND ATTENUATION MEMBERS BETWEEN OR AROUND THE PLURALITY OF FUSE ELEMENTS

TECHNICAL FIELD

The present invention relates to a semiconductor device, and more particularly relates to a semiconductor device having a fuse element which can be disconnected by irradiating a laser beam to this fuse element. The present invention also relates to a method of disconnecting a fuse element, and more particularly relates to a method of disconnecting a fuse element by irradiating a laser beam to this fuse element.

BACKGROUND OF THE INVENTION

A memory density of semiconductor memory devices as represented by a DRAM (Dynamic Random Access Memory) increases year by year based on progress of microfabrication. However, along the progress of microfabrication, the number of defective memory cells included in one chip also increases in the actual situation. These defective memory cells are usually replaced by redundant memory cells, thereby relieving defective addresses.

In general, defective addresses are stored in a program circuit including plural fuse elements. When an access to a defective address is requested, the program circuit detects this access, and performs so that the alternate access is made to a redundant memory cell instead of this defective memory cell. As a configuration of the program circuit, there is known a system that allocates a pair of (that is, two) fuse elements to each bit constituting an address to be stored, and that stores a desired address by disconnecting one of the pair of fuse elements, as described in Japanese Patent Application Laid-open No. H9-69299.

There is also known a system that allocates one fuse element to each bit constituting an address to be stored, as described in Japanese Patent Application Laid-open No. H6-119796. According to this system, one bit can be stored depending on whether one fuse element is to be disconnected. Therefore, the number of fuse elements can be substantially decreased.

There are broadly two methods of disconnecting a fuse element: a method of disconnecting a fuse element by fusing the fuse element using a large current (see Japanese Patent Application Laid-open Nos. 2005-136060 and 2003-501835); and a method of disconnecting a fuse element by breaking the fuse element by irradiating a laser beam (see Japanese Patent Application Laid-open Nos. H7-74254 and H9-36234). The former method has advantages in that the method requires no expensive device such as a laser trimmer, and can easily self-diagnose whether a fuse element is correctly disconnected. However, in using this method, a fuse disconnecting circuit and a diagnosis circuit need to be incorporated in a semiconductor in advance. This has a disadvantage of increasing a chip area.

On the other hand, the method of breaking a fuse element by irradiating a laser beam does not require a fuse disconnecting circuit to be incorporated in a semiconductor device in advance. Therefore, a chip area can be decreased by this method.

FIG. 11 is a schematic cross-sectional view for explaining a method of disconnecting a conventional fuse element by irradiating a laser beam.

A fuse element 10 shown in FIG. 11 is located on a higher layer than lower-layer wirings 11, and both ends of the fuse element 10 are connected to the lower-layer wirings 11 via through-hole electrodes 12. To disconnect the fuse element 10 having this configuration, a laser beam L is irradiated to the fuse element 10 from above the fuse element 10. In this case, the laser beam L is converged to include the fuse element 10 within a focal depth of the laser beam L, thereby focusing heat energy onto the fuse element 10 to disconnect the fuse element 10.

Before the fuse element 10 is disconnected, the two lower-layer wirings 11 shown in FIG. 11 are electrically connected to each other. When the fuse element 10 is disconnected, the two lower-layer wirings 11 are electrically insulated. In this way, a connection state of the lower-layer wirings 11 can be irreversibly changed by using the fuse element 10. With this arrangement, a defective address can be stored permanently.

To store a defective address and the like, many fuse elements 10 need to be laid out. Therefore, at the time of disconnecting a predetermined fuse element by irradiating a laser beam, influence given to adjacent fuse elements and to their peripheries need to be considered.

FIG. 12 and FIG. 13 are explanatory views of the influence applied by the laser beam to other fuse elements and to their peripheries. FIG. 12 is a top plan view, and FIG. 13 is a schematic cross-sectional view along a line D-D shown in FIG. 12.

As shown in FIG. 12 and FIG. 13, at the time of disconnecting a predetermined fuse element 10a by the laser beam L, a beam spot of the laser beam L is narrowed by the fuse element 10a to have a minimum diameter $D_1$. However, not all the energy of the laser beam L is absorbed by the fuse element 10a, and a part of the laser beam L is leaked out to a semiconductor substrate outside the fuse element 10a. Because the beam spot of the laser beam L is narrowed to a minimum at the fuse element 10a, the beam spot of the laser beam L becomes larger than $D_1$ at the semiconductor substrate side than at the fuse element 10a.

Therefore, when a planar distance between adjacent fuse elements 10a and 10b is short, the laser beam L is irradiated to a peripheral circuit of the fuse element 10b, as shown in FIG. 12 and FIG. 13. In the example shown in FIG. 12 and FIG. 13, when a layout pitch of the fuse elements 10a and 10b is P, the beam spot of the laser beam L extends to about 2P (=$D_2$). As a result, the laser beam L is irradiated to the lower-layer wiring 11b and the thorough-hole electrode 12b.

In the state that the beam spot is spread, while the energy density of the laser beam L is low, the adjacent lower-layer wiring 11b and the thorough-hole electrode 12b have a risk of being greatly damaged depending on conditions. For example, when the through-hole electrode 12b pierces through a part of an insulation layer having a high light-absorbing rate like a silicon nitride film, the through-hole electrode 12b has a risk of being broken at this part. Therefore, when the layout pitch P of the fuse element is narrowed, this has a problem of a reduction in the reliability of the semiconductor device. To prevent this problem, the layout pitch P of the fuse elements is set large. However, in this case, the number of fuse elements that can be laid out per unit area decreases.

As described above, the method of breaking fuse elements by irradiating a laser beam has the problem in that reliability decreases when the layout pitch P of fuse elements is made small, and that the degree of location becomes low when the layout pitch P of fuse elements is increased. Even when only one fuse element is laid out, the laser beam L spread to below the fuse element has a risk of damaging various kinds of lower-layer wirings and the semiconductor substrate.

SUMMARY OF THE INVENTION

The present invention has been achieved to solve the above problems, and an object of the present invention is to provide an improved semiconductor device having a fuse element that can be disconnected by irradiating a laser beam to this fuse element, and an improved method of disconnecting a fuse element.

Another object of the present invention is to provide a semiconductor device that can narrow a layout pitch of fuse elements while securing reliability, and a method of disconnecting the fuse element.

Still another object of the present invention is to provide a semiconductor device giving little influence to fuse elements adjacent to a predetermined fuse element and peripheries of the fuse elements at the time of disconnecting the predetermined fuse element, and a method of disconnecting the fuse element.

The semiconductor device according to the present invention includes: a plurality of fuse elements which can be disconnected by irradiating a laser beam; and attenuation members that can attenuate the laser beam located between the plurality of fuse elements as viewed two-dimensionally.

The method for disconnecting a fuse element provided on a semiconductor device according to the present invention includes: irradiating a laser beam so as to form a first beam spot and a second beam spot by focusing a laser beam using a optical lens, the second spot being farther from the optical lens than from the first beam spot and having a larger diameter than that of the first beam spot, at least a part of the fuse element being included within the first beam spot and at least a part of an attenuation member capable of attenuating the laser beam being included within the second beam spot; and disconnecting the fuse element by the laser beam.

Preferably, the attenuation members are located nearer to the semiconductor substrate side than to the fuse elements. Further, the attenuation members preferably include columnar bodies extending to a direction approximately perpendicular to the semiconductor substrate. The concept of the "columnar bodies" includes cylindrical bodies each having a cavity, in addition to circular cylinders and rectangular columns. A diameter of each columnar body does not need to be constant in an axial direction. Preferably, as viewed two-dimensionally, the columnar bodies are laid out on straight lines connecting between a predetermined fuse element and through-hole electrodes connected to other fuse elements adjacent to the fuse elements or near to the straight lines.

According to the present invention, the attenuation members attenuate unnecessary energy of a laser beam. Therefore, at the time of disconnecting a predetermined fuse element, influence given to the adjacent fuse element and its periphery can be decreased. Accordingly, a layout pitch of the fuse elements can be narrowed while securing reliability. Even when only one fuse element is laid out, the energy of the laser beam spread to below the fuse element can be attenuated. Consequently, damage applied to various lower-layer wirings and to the semiconductor substrate can be decreased.

When columnar bodies extending to a direction approximately perpendicular to the semiconductor substrate are used as the attenuation members, the columnar bodies themselves can absorb the energy of the laser beam and can also scatter the laser beam. Therefore, the columnar bodies can efficiently attenuate the laser beam, without generating a crack in the insulation film by absorbing excessive energy.

Particularly, when the columnar bodies are laid out on straight lines connecting between a predetermined fuse element and through-hole electrodes connected to other fuse elements adjacent to the fuse elements or near to the straight lines, as viewed two-dimensionally, the through-hole electrodes which are not desired to broken can be located in an area where laser beam is weakened by the interference of the Fresnel diffraction, when a laser beam is irradiated to the fuse element to be broken. Accordingly, a risk that the through-hole electrode connected to the adjacent fuse element is broken becomes very small.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained below in detail with reference to the accompanying drawings.

Figure 1:
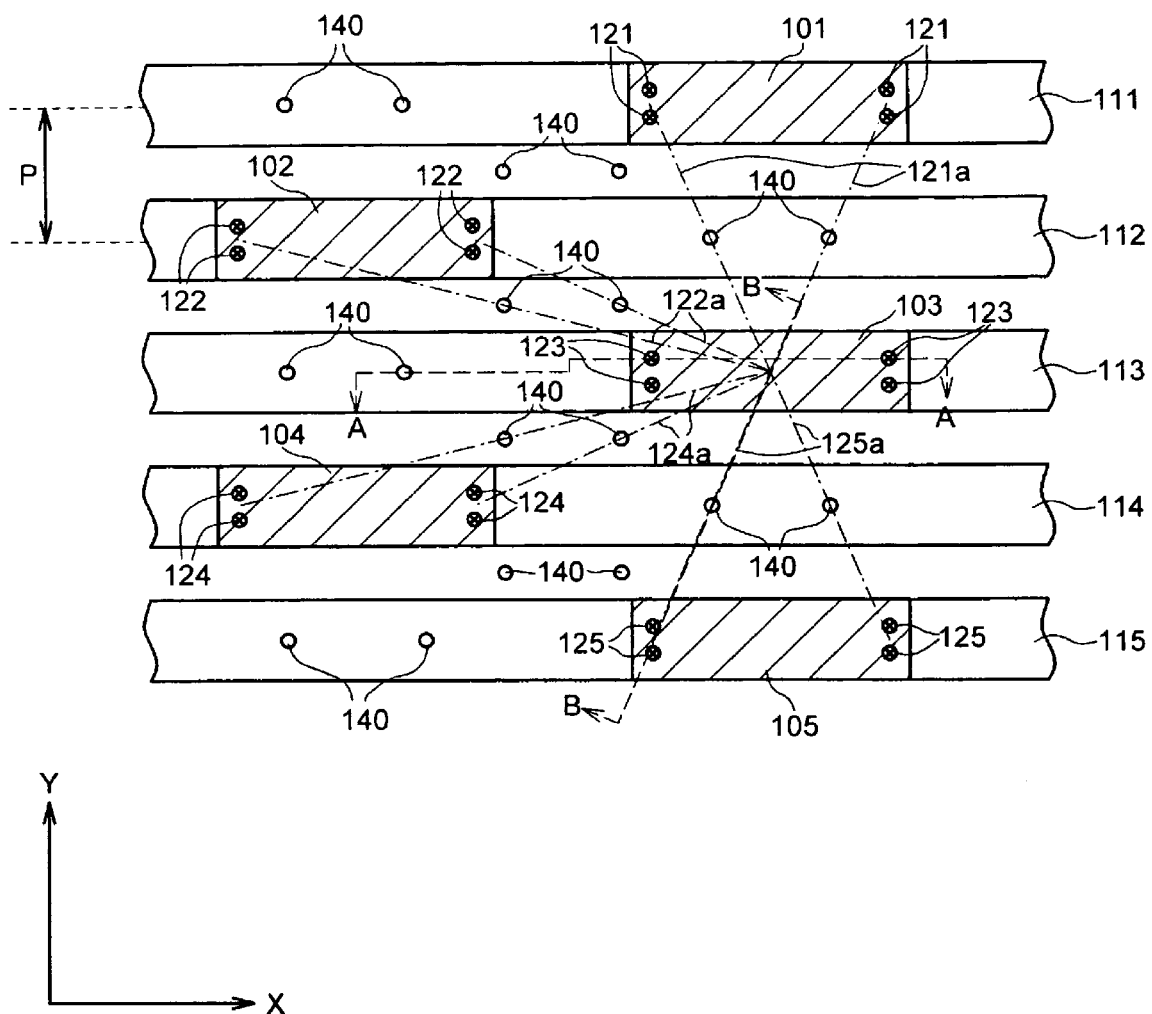
FIG. 1 is a schematic top plan view showing a configuration of main parts of a semiconductor device according to one embodiment of the present invention.
Figure 2:
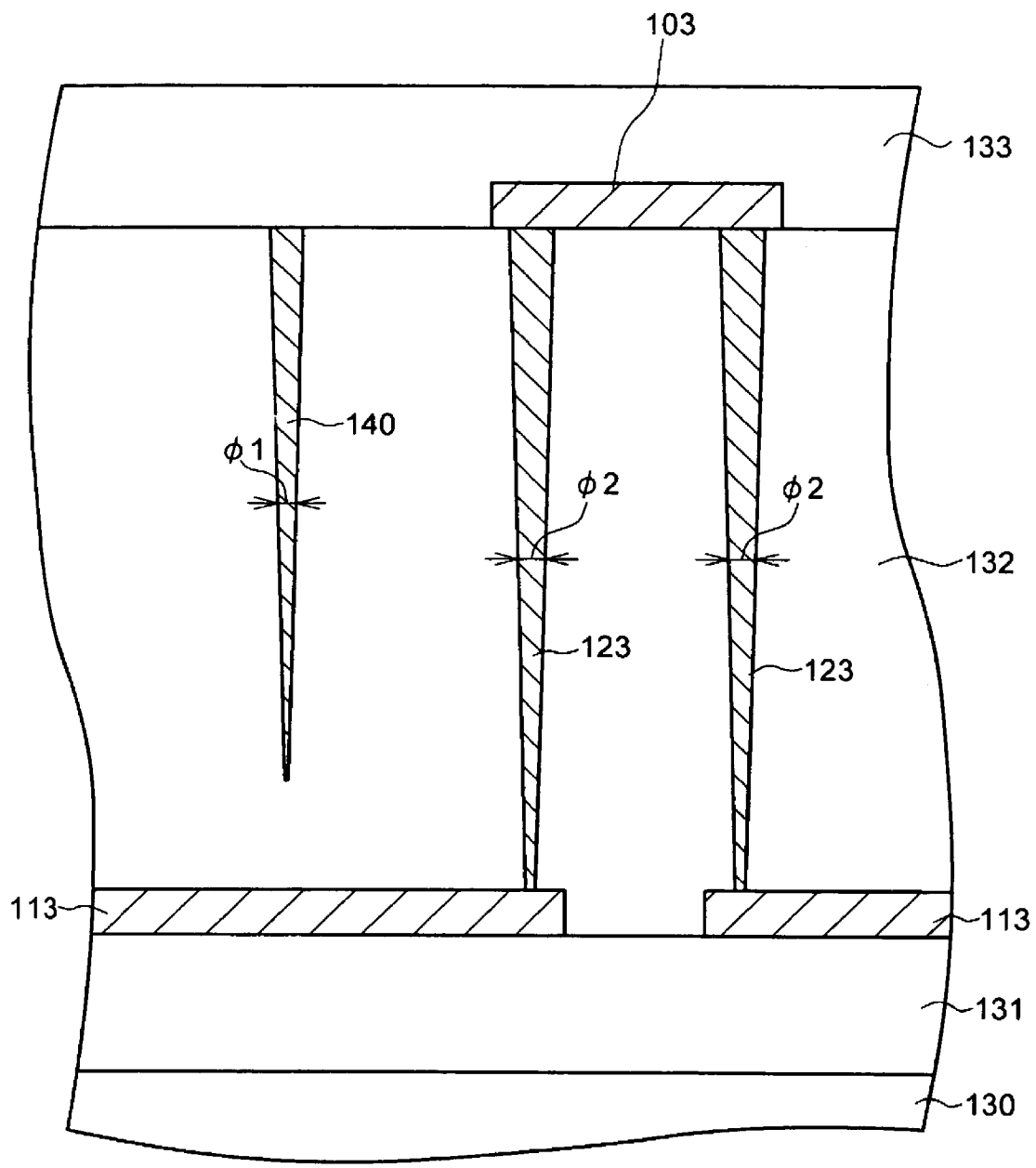
FIG. 2 is a schematic cross-sectional view along a line A-A shown in FIG. 1.
Figure 3:
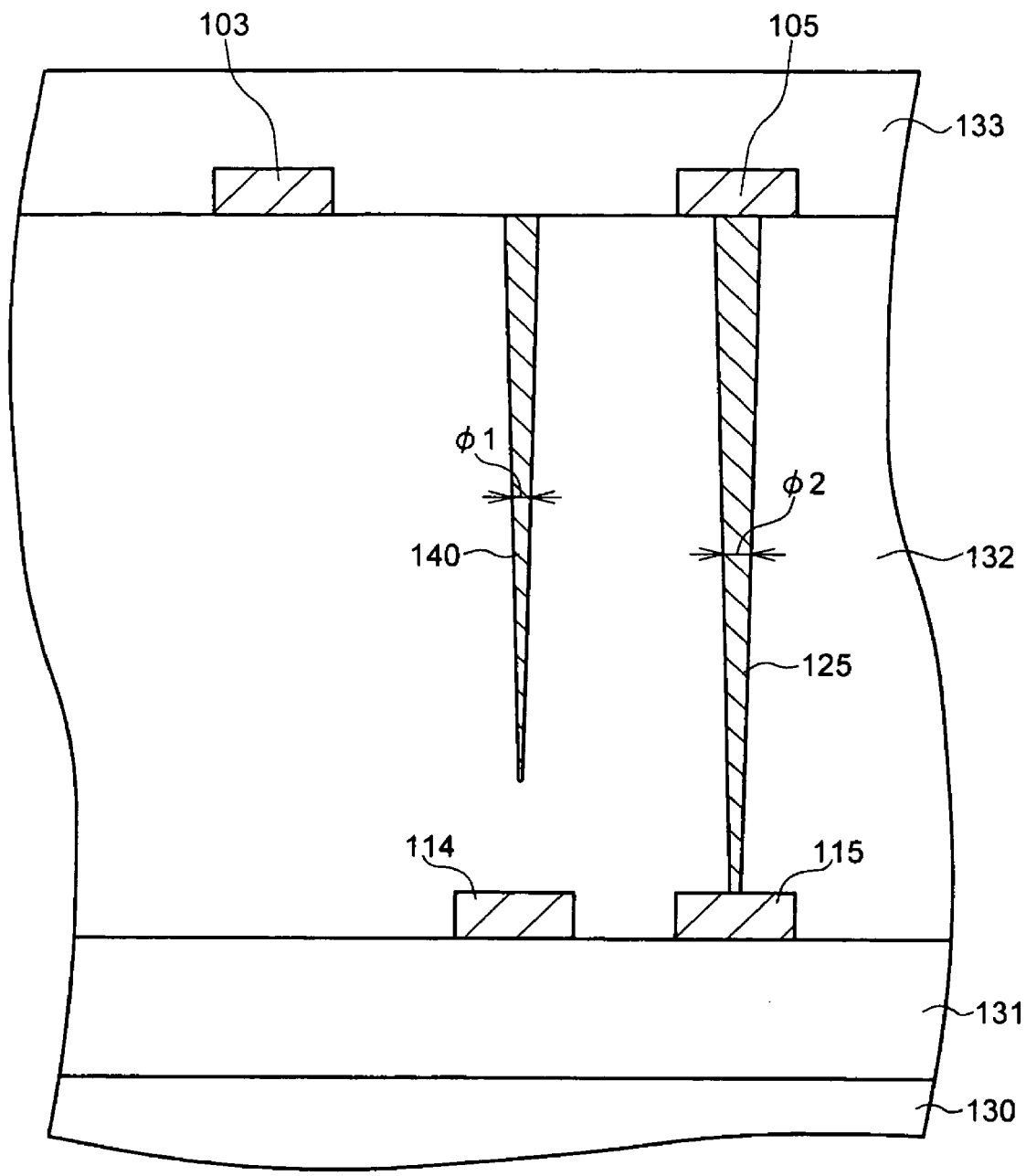
FIG. 3 is a schematic cross-sectional view along a line B-B shown in FIG. 1.

FIG. 1 is a schematic top plan view showing a configuration of main parts of a semiconductor device according to one embodiment of the present invention. FIG. 2 is a schematic cross-sectional view along a line A-A shown in FIG. 1, and FIG. 3 is a schematic cross-sectional view along a line B-B shown in FIG. 1.

As shown in FIG. 1, the semiconductor device according to the present embodiment has plural fuse elements 101 to 105. The fuse elements 101 to 105 are connected to lower-layer wirings 111 to 115 extending to the X direction, respectively.

In the present embodiment, the fuse elements 101 to 105 connected to the adjacent lower-layer wirings 111 to 115 are deviated to the X direction, respectively. That is, the fuse elements 101 to 105 are laid out in zigzag manner. This layout is made to secure high degree of location and to increase distances between the fuse elements 101 to 105. Based on this zigzag layout, from the viewpoint of the fuse element 103 at the center, for example, the fuse element 103 is adjacent to the fuse elements 101 and 105 in the Y direction, and is adjacent to the fuse elements 102 and 104 in approximately the X direction.

The fuse elements 101 to 105 and the lower-layer wirings 111 to 115 are connected to each other via through-hole electrodes 121 to 125, respectively. As shown in FIG. 1, each of the fuse elements 101 to 105 is allocated with two through-hole electrodes 121 to 125, respectively, at each one end of each fuse element. With this arrangement, four through-hole electrodes in total are used per one fuse element. This arrangement is made to prevent generation of a conduction failure due to variations of process at the manufacturing time. Therefore, in the present invention, it is not essential to allocate two through-hole electrodes to each one end of each of the fuse elements 101 to 105.

The through-hole electrodes 121 to 125 are provided through an insulation film 132, as shown in FIG. 2 and FIG. 3. An insulation film 132 is an inter-layer insulation film for separating the lower-layer wirings 111 to 115 from the fuse elements 101 to 105. The insulation film 132 can include one-layer insulation film or can be a lamination of plural insulation films. On an upper surface of the semiconductor substrate 130, an insulation film 131 which becomes a formation surface of the lower-layer wirings 111 to 115, and an insulation film 133 which covers the fuse elements 101 to 105 are formed. Each of these insulation films can be a one-layer insulation film or a lamination of plural insulation films.

As shown in FIG. 1, in the semiconductor device according to the present embodiment, attenuation members 140 that can attenuate laser beams are laid out around the fuse elements 101 to 105, as viewed two-dimensionally. The "viewed two-dimensionally" means "viewed from a direction approximately perpendicularly to the main surface of the semiconductor substrate 130". In the present embodiment, the attenuation member 140 includes plural columnar bodies.

The columnar bodies constituting the attenuation members 140 are embedded into the insulation film 132, and extend to a direction approximately perpendicular to the semiconductor substrate 130. As explained above, the attenuation members 140 are provided in the same layers as those of the through-hole electrodes 121 to 125. With this arrangement, the whole attenuation members 140 are located nearer to the semiconductor substrate 130 side than to the fuse elements 101 to 105. The columnar bodies constituting the attenuation members 140 are made of the same conductive material (for example, tungsten) as that of the through-hole electrodes 121 to 125. While the columnar bodies constituting the attenuation members 140 do not need to be made of the same conductive material as that of the through-hole electrodes 121 to 125, when these are the same conductive materials, the attenuation members 140 and the through-hole electrodes 121 to 125 can be manufactured in the same process.

As shown in FIG. 2 and FIG. 3, the length (height) of the columnar bodies constituting the attenuation members 140 is smaller than that of the through-hole electrodes 121 to 125. Therefore, even when the columnar bodies are laid out immediately above the lower-layer wirings 111 to 115, the columnar bodies are not in contact with the lower-layer wirings 111 to 115, and are insulated. In the present embodiment, the attenuation members 140 is not in contact with any conductive pattern, and therefore, is electrically in a floating state.

Diameters φ1 of the columnar bodies constituting the attenuation members 140 are set smaller than diameters φ2 of the through-hole electrodes 121 to 125. This is because when the diameter of the through-hole into which the attenuation member 140 is embedded is made small at the time of forming the through-hole by etching the insulation film 132, the depth of this through-hole can be made smaller (or, the height can be made smaller) than the through-hole for forming the through-hole electrodes 121 to 125. Because the through-hole into which the attenuation member 140 is embedded and the through-hole for forming the through-hole electrodes 121 to 125 can be formed by etching the insulation film 132 in this way, the diameter is larger upward and is smaller downward. Therefore, the diameter φ1 of the columnar body can be compared with the diameter φ2 of the through-hole electrode at approximately the center of each height in the height direction.

As shown in FIG. 1, the columnar bodies constituting the attenuation members 140 are disposed between adjacent fuse elements, as viewed two-dimensionally. More specifically, the columnar bodies are laid out on straight lines connecting between a predetermined fuse element and through-hole electrodes connected to other fuse elements adjacent to the fuse elements or near to the straight lines, as viewed two-dimensionally. For example, from the viewpoint of the fuse element 103, the columnar bodies are laid out on straight lines 121a, 122a, 124a, and 125a that connect between the fuse element 103 and the through-hole electrodes 121, 122, 124, and 125, respectively.

In the semiconductor device according to the present embodiment, the lower-layer wirings 111 to 115, each having two wirings, are also in the conductive state before the fuse elements 101 to 105 are disconnected. However, when the fuse elements 101 to 105 are disconnected, these two lower-layer wirings 111 to 115 become in the insulation state. Accordingly, the disconnection state of the lower-layer wirings 111 to 115 can be irreversibly changed. Consequently, a defective address and the like can be stored permanently.

A method of disconnecting the fuse element is explained next.

In the present embodiment, the fuse elements 101 to 105 are disconnected by irradiating a laser beam.

Figure 4:
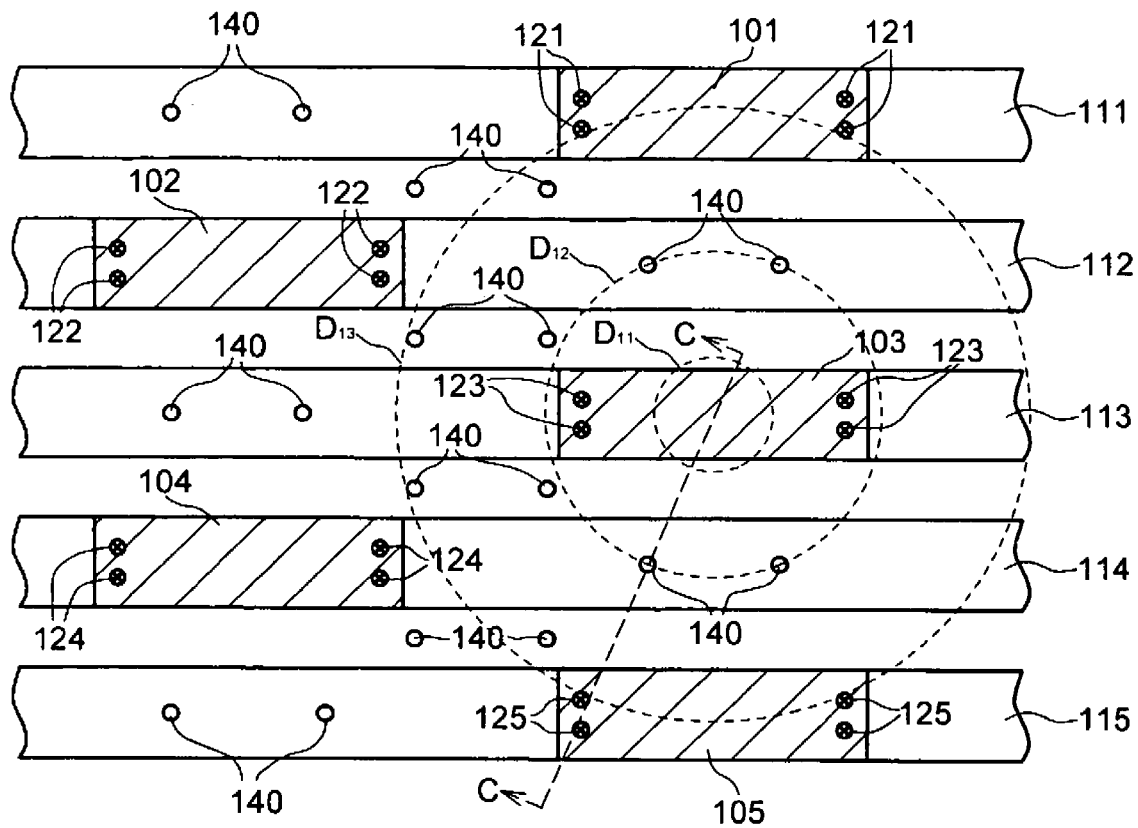
FIG. 4 is a schematic top plan view showing a position of a beam spot of the laser beam L.
Figure 5:
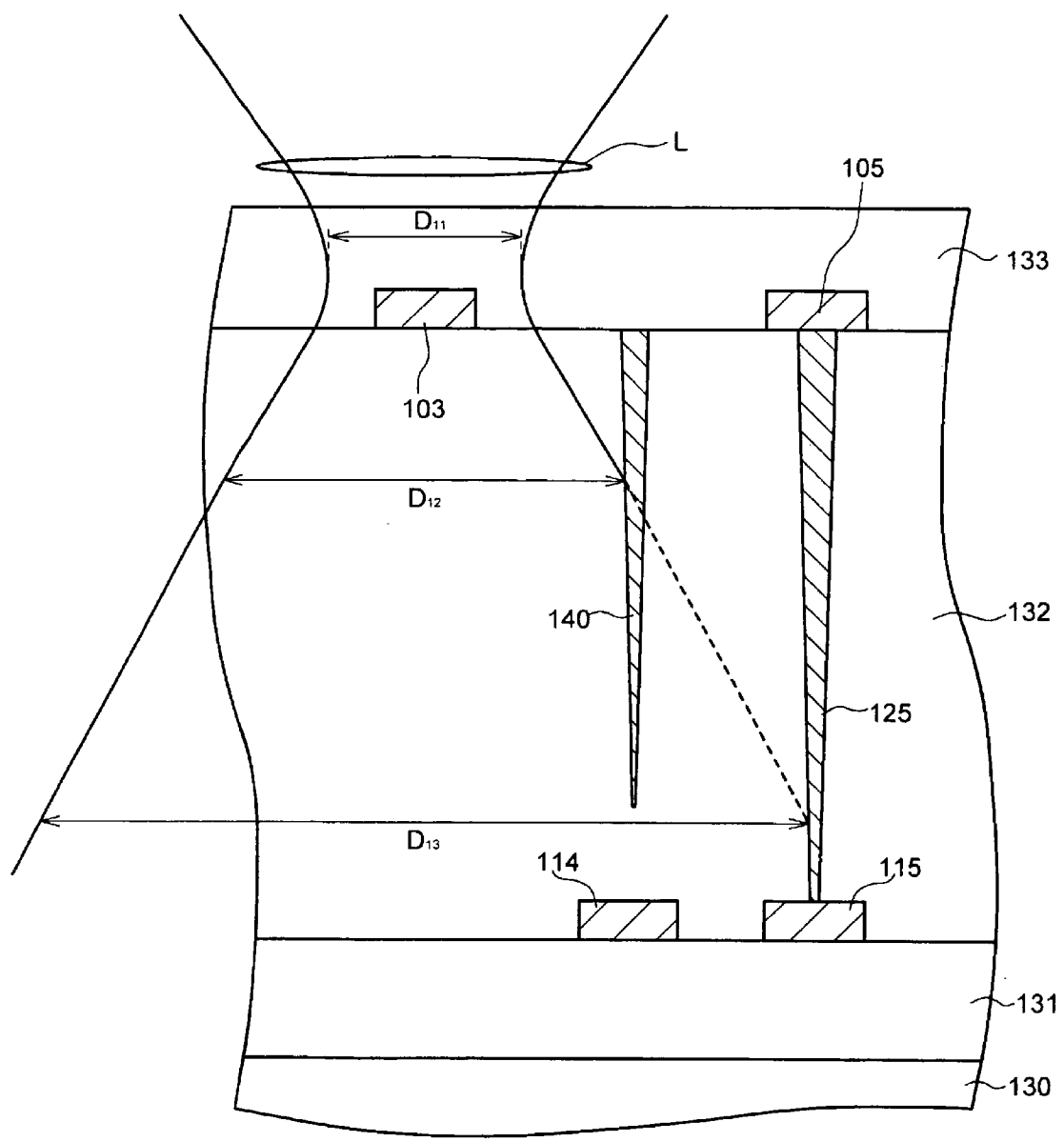
FIG. 5 is a schematic cross-sectional view along a line C-C shown in FIG. 4.

FIG. 4 is a schematic top plan view showing a position of a beam spot of the laser beam L which is irradiated at the time of disconnecting the fuse element 103. FIG. 5 is a schematic cross-sectional view along a line C-C shown in FIG. 4.

As shown in FIG. 4 and FIG. 5, to disconnect the fuse element 103, the laser beam L is irradiated to the fuse element 103 from above the fuse element 103. In this case, the laser beam L is converged to include the fuse element 103 within a focal depth of the laser beam L, using an optical lens (not shown). A beam spot of the laser beam L becomes the smallest ($=D_{11}$), within the focal depth. Accordingly, most of the energy of the laser beam L is absorbed by the fuse element 103, and heat energy is concentrated to the fuse element 103, thereby disconnecting the fuse element 103.

As explained above, because not all energy of the laser beam L is absorbed by the fuse element 103, a part of the laser beam L leaks out to the semiconductor substrate 130 from the fuse element 103. Because the beam spot of the laser beam L is narrowed to a minimum size by the fuse element 103 as described above, the beam spot of the laser beam L becomes larger than $D_{11}$, at the semiconductor substrate side than on the fuse element 103.

The laser beam L leaked out to the semiconductor substrate 130 from the fuse element 103 (to the side away from the optical lens) is irradiated to the attenuation member 140, because the diameter of the beam spot is increased to $D_{12}$. Accordingly, a part of the leaked energy of the laser beam L is absorbed by the attenuation member 140. However, in the present embodiment, because the attenuation member 140 is a columnar body, the attenuation member 140 cannot completely shield the laser beam L.

When the diameter of the beam spot of the laser beam increases to $D_{13}$, the laser beam L is irradiated to the lower-layer wirings 111 to 115 and the through-hole electrodes 121 and 125. However, because a part of the leaked energy of the laser beam L is absorbed by the attenuation member 140 and because the non-absorbed energy is scattered by the attenuation member 140, the energy added to the lower-layer wirings and the through-hole electrodes is very small.

Further, in the present embodiment, the attenuation members 140 are laid out on straight lines connecting between the fuse element 103 to be disconnected and the through-hole electrodes 121, 122, 124, and 125 not to be broken, or near to the straight lines, as viewed two-dimensionally. Therefore, the through-hole electrodes 121, 122, 124, and 125 are located in the shade of the attenuation member 140. A position that becomes the shade of the attenuation member 140 is in the area where energy of the laser beam L is weakened by the interference of the Fresnel diffraction. Therefore, the energy irradiated to this area becomes significantly smaller than the energy irradiated to other areas.

Figure 6A:
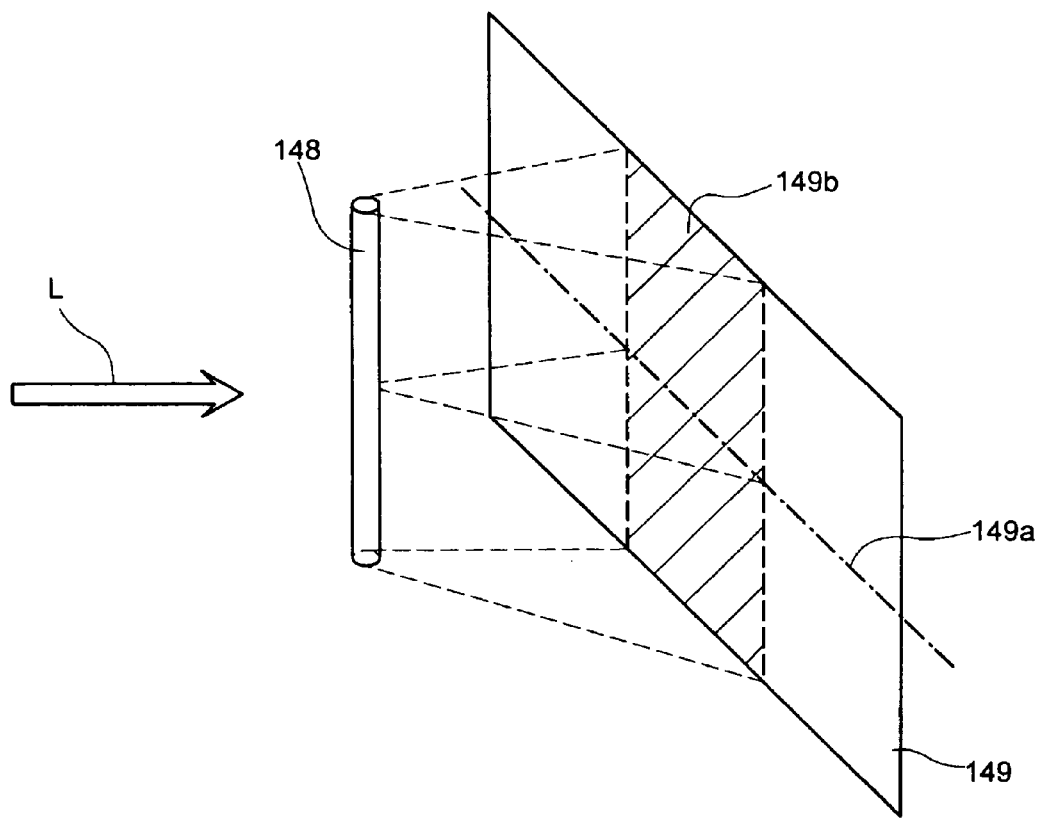
FIG. 6A is a pattern diagram when the laser beam L is irradiated to a columnar body from one direction.
Figure 6B:
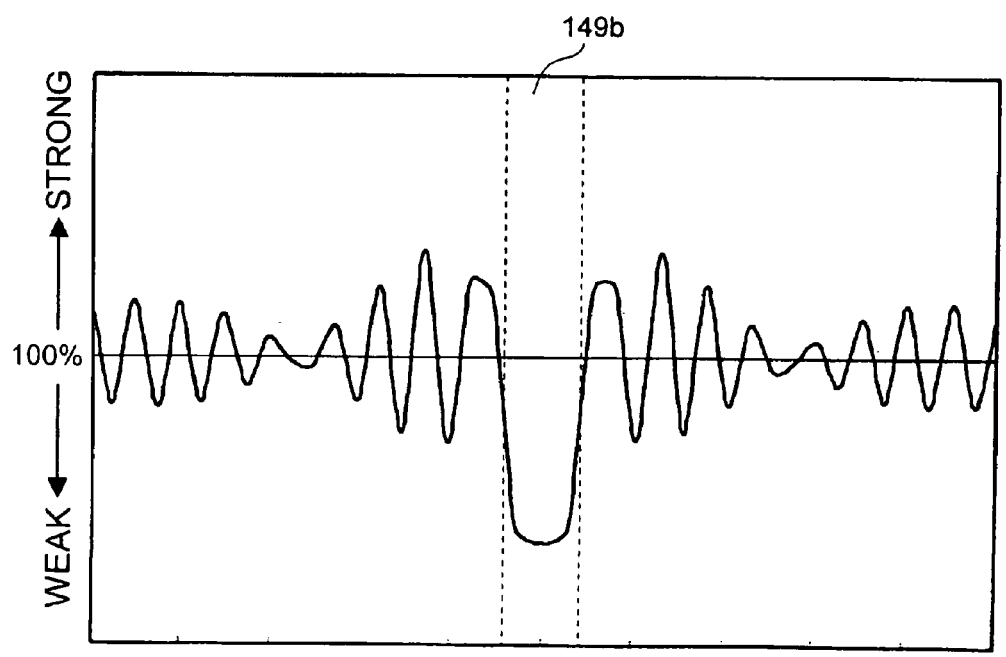
FIG. 6B is a schematic graph showing an energy distribution of the laser beam L appearing on a straight line shown in FIG. 6A.

That is, when the laser beam L is irradiated to a columnar body 148 from one direction as shown in FIG. 6A, and when the diameter of the columnar body 148 is sufficiently smaller than the wavelength of the laser beam L, an interference pattern appears by diffraction on a plane surface 149 located at the back of the columnar body 148. FIG. 6B is a schematic graph showing an energy distribution of the laser beam L appearing on a straight line 149a on the plane surface 149. In FIG. 6B, the intensity of the laser beam L when the columnar body 148 is not present is expressed as 100%.

As shown in FIGS. 6A and 6B, in the area 149b which becomes the shade of the columnar body 148, the energy is weakened by the interference of the Fresnel diffraction. Therefore, the intensity of the laser beam L becomes very low within this area 149b.

Therefore, it is appropriate to arrange the layout such that the through-hole electrode is located in a range corresponding to the area 149b that becomes the shade of the columnar body 148 when the laser beam L is irradiated to a predetermined fuse element. That is, the columnar bodies becoming the attenuation members 140 are laid out on straight lines connecting between the fuse element to be disconnected and the through-hole electrodes not to be broken, or near to the straight lines, as viewed two-dimensionally. Based on this layout, a risk that the through-hole electrode is broken becomes very small. This means that the layout pitch P of the fuse elements can be made small while securing reliability, as compared with the conventional technique.

Advantages of using the columnar body as the attenuation member 140 are explained below.

To effectively attenuate the laser beam L leaked out from the fuse element to the semiconductor substrate 130, a plate-like body is used instead of the columnar body as the attenuation member 140. However, when the columnar body is used as the attenuation member 140, most of the leaked energy of the laser beam L is absorbed by the attenuation member 140. Therefore, the attenuation member 140 is swollen by overheating some times, and the surrounding insulation film has a risk of being broken as a result.

As described above, the attenuation member 140 is not connected to any conductive pattern, and is electrically in the floating state. Therefore, the attenuation member 140 itself may be broken. However, when the attenuation member 140 is swollen to crack the insulation film, there is a risk of the occurrence of an insulation failure and immersion of water, resulting in a reduction of the reliability of the device. On the other hand, when the columnar body is used as the attenuation member 140 like in the present embodiment, this risk can be decreased. That is, when interference by the Fresnel diffraction is used instead of absorbing a large amount of energy into the attenuation member 140 itself, breaking of the insulation film can be prevented, and the laser beam L can be effectively shielded.

To sufficiently obtain the effect of diffraction by the Fresnel diffraction, preferably, the diameter $\phi 1$ of the columnar body is set smaller than the wavelength of the laser beam L. For example, when the wavelength of the laser beam L is about 1,000 nm, the diameter $\phi 1$ of the columnar body is set to about 200 nm.

To effectively prevent the breaking of the insulation film, it is most preferable to provide a cavity inside the columnar body. That is, the attenuation member 140 preferably includes a cylindrical body.

Figure 7A:
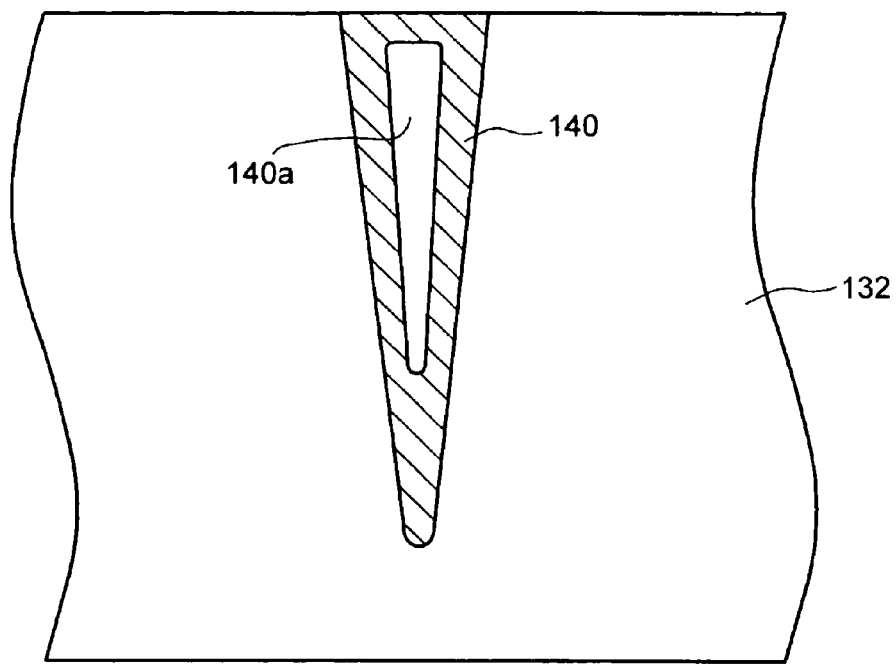
FIG. 7A is a schematic cross-sectional view showing a configuration of a cylindrical body constituting the attenuation material showing a state before the laser beam L is irradiated.
Figure 7B:
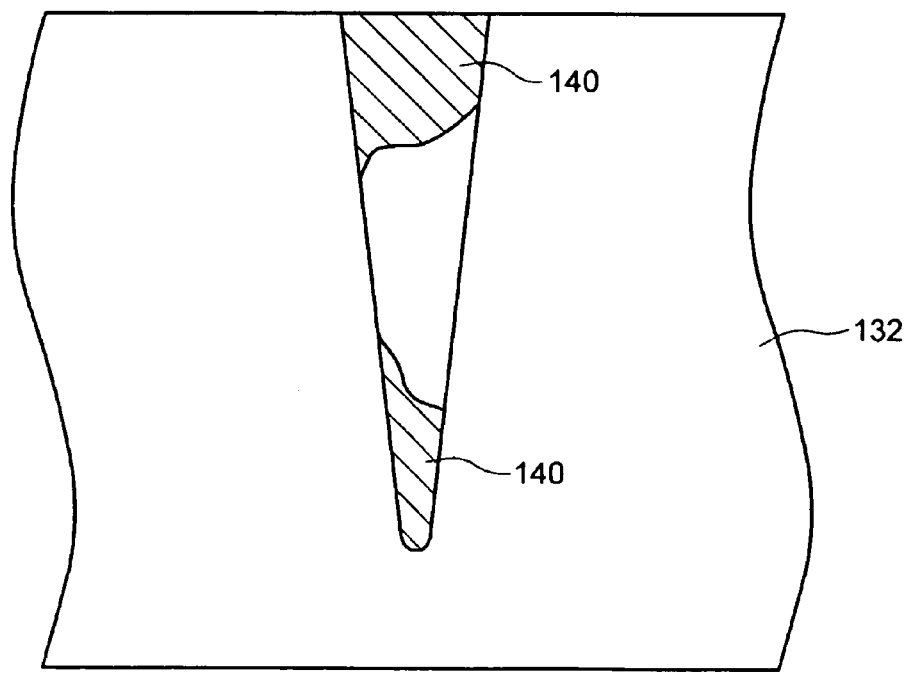
FIG. 7B is a schematic cross-sectional view showing a configuration of a cylindrical body constituting the attenuation material showing a state that the cylindrical body is deformed by the irradiation of the laser beam L.

FIGS. 7A and 7B are schematic cross-sectional views showing a configuration of a cylindrical body constituting the attenuation material 140: FIG. 7A shows a state before the laser beam L is irradiated; and FIG. 7B shows a state that the cylindrical body is deformed by the irradiation of the laser beam L.

As shown in FIG. 7A, when the attenuation member 140 includes a cylindrical body, a cavity 140a encircled by the attenuation member 140 is present. This cavity 140a plays a role of absorbing expansion energy when the laser beam L is irradiated. That is, when the laser beam L is irradiated to the attenuation member 140 as the cylindrical body, the attenuation member 140 is expanded and deformed within the through-hole without breaking the insulation film 132, as shown in FIG. 7B. When the attenuation member 140 includes a cylindrical body in this way, damage to the insulation film can be decreased, even when the attenuation member 140 is expanded and deformed by the energy of the laser beam L.

This cylindrical body can be formed by depositing the attenuation member 140 by the process of low coverage, after the through-hole is formed in the insulation film 132. When the process of high coverage is used, a cavity unavoidably remains when the aspect ratio of the through-hole is large, and the cylindrical body can be manufactured using this.

As explained above, according to the semiconductor device of the present embodiment, the attenuation members 140 including plural cylindrical bodies are laid out between adjacent fuse elements, as viewed two-dimensionally. Therefore, the laser beam L leaked out to below the fuse element to be broken can be absorbed and scattered. Accordingly, at the time of disconnecting a predetermined fuse element, the influence given to the adjacent fuse elements and their peripheries can be decreased. Consequently, the layout pitch of the fuse elements can be made small while securing reliability.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

Figure 8:
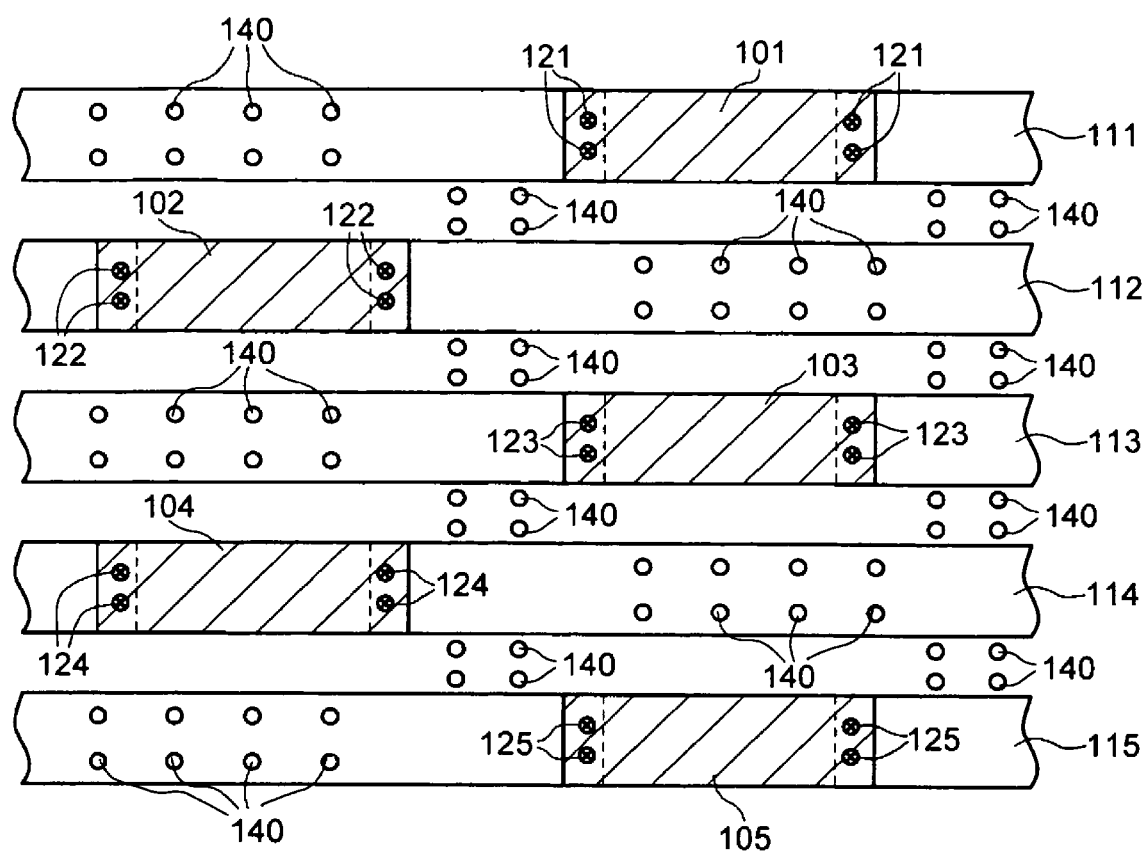
FIG. 8 is a schematic top plan view showing a configuration of main parts of a semiconductor device according to one variant embodiment.

In the above embodiment, the columnar bodies constituting the attenuation members 140 are laid out on the straight lines 121a, 122a, 124a, and 125a or near these straight lines (see FIG. 1). However, the layout is not limited to this. Therefore, as shown in FIG. 8, the columnar bodies constituting the attenuation member 140 can be laid out in dispersion between the adjacent fuse elements 101 to 105. In the example shown in FIG. 8, plural columnar bodies laid out in matrix in the X direction and the Y direction are laid out between the adjacent fuse elements 101 to 105. According to the above configuration, the leaked laser beam L can be scattered by many columnar bodies.

Figure 9:
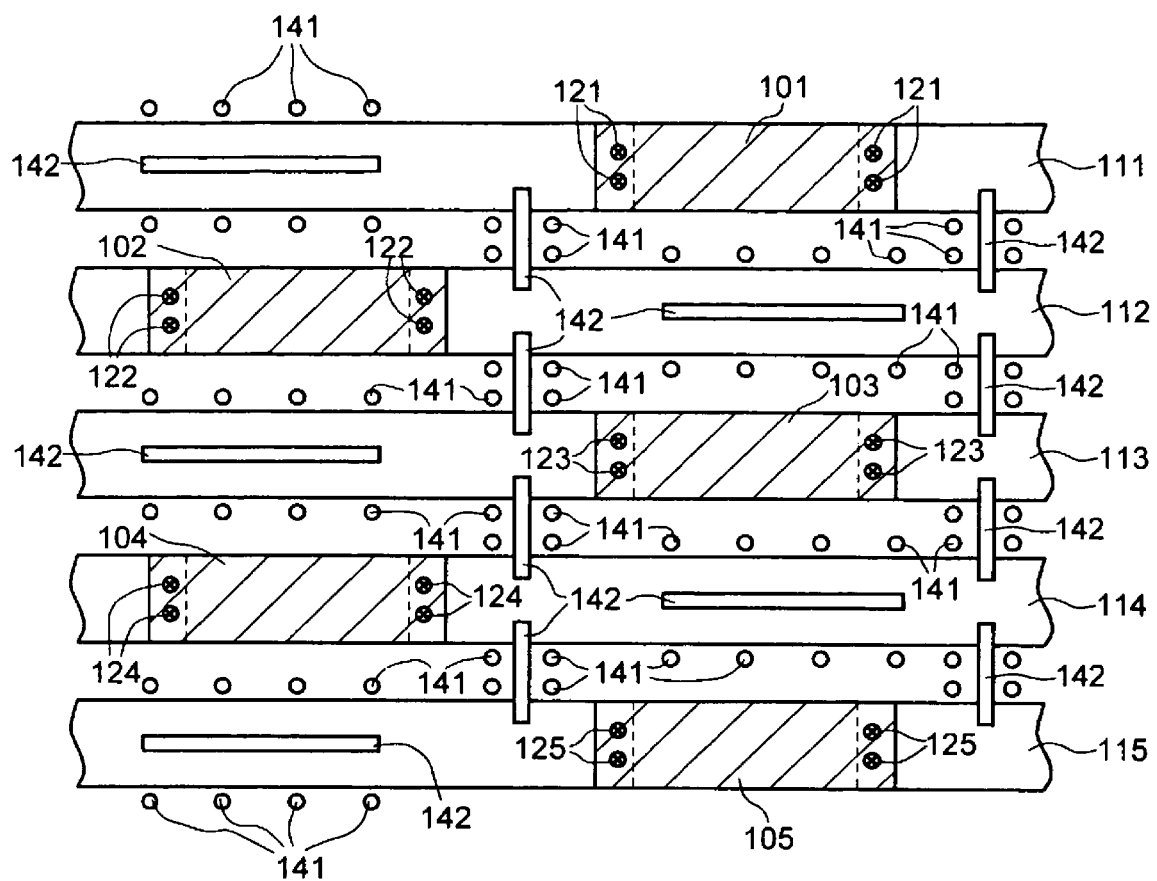
FIG. 9 is a schematic top plan view showing a configuration of main parts of a semiconductor device according to another variant embodiment.

In the above embodiment, while plural columnar bodies constitute the attenuation member 140, the present invention is not limited to this configuration. Therefore, as shown in FIG. 9, plural columnar bodies 141 and plate-like bodies 142 laid out between these columnar bodies 141 can be laid out between adjacent two fuse elements, and these can be used as attenuation members. According to this configuration, the columnar bodies 141 can absorb and scatter the energy of the laser beam L, and the plate-like bodies 142 can shield the scattered laser beam L. With this arrangement, the influence given to the adjacent fuse elements and their peripheries can be decreased substantially. The columnar bodies 141 weaken, to some extent, the laser beam L irradiated to the plate-like bodies 142. Therefore, the plate-like bodies 142 can be prevented from being swollen by overheating, and the risk that the surrounding insulation film is broken is small.

In the above embodiment, while the diameter φ1 of each attenuation member 140 as the columnar body is set smaller than the diameter φ2 of each of the through-hole electrodes 121 to 125, these diameters can be set the same. The diameter φ1 of each attenuation member as the columnar body is set smaller than the diameter φ2 of each of the through-hole electrodes 121 to 125, to prevent the attenuation members 140 from being in contact with the lower-layer wirings 111 to 115, as described above. When this contact can be prevented by other method, the diameter of the attenuation member 140 does not need to be smaller.

Figure 10:
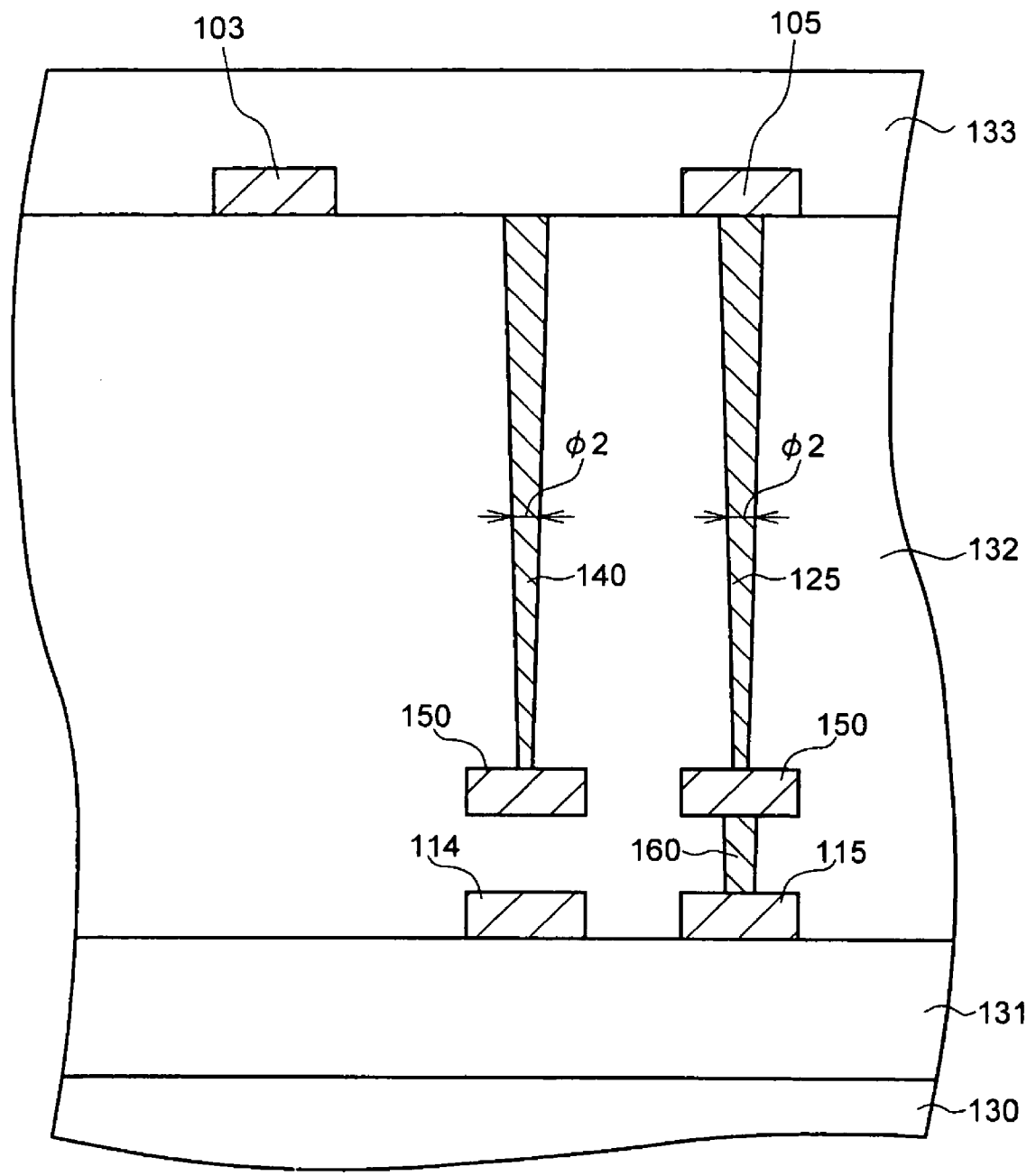
FIG. 10 is a schematic top plan view showing a configuration of main parts of a semiconductor device according to still another variant embodiment.
Figure 11:
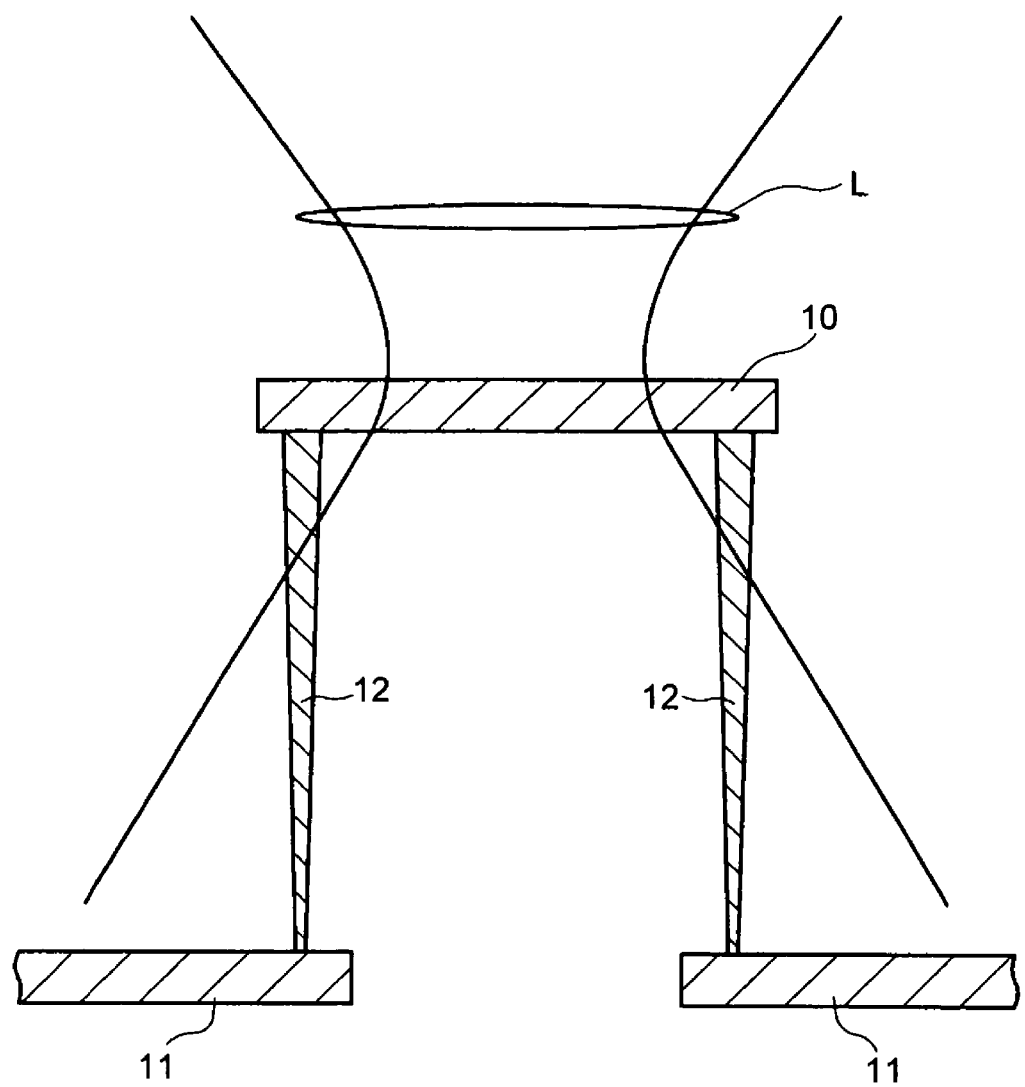
FIG. 11 is a schematic cross-sectional view for explaining a method of disconnecting a conventional fuse element by irradiating a laser beam.
Figure 12:
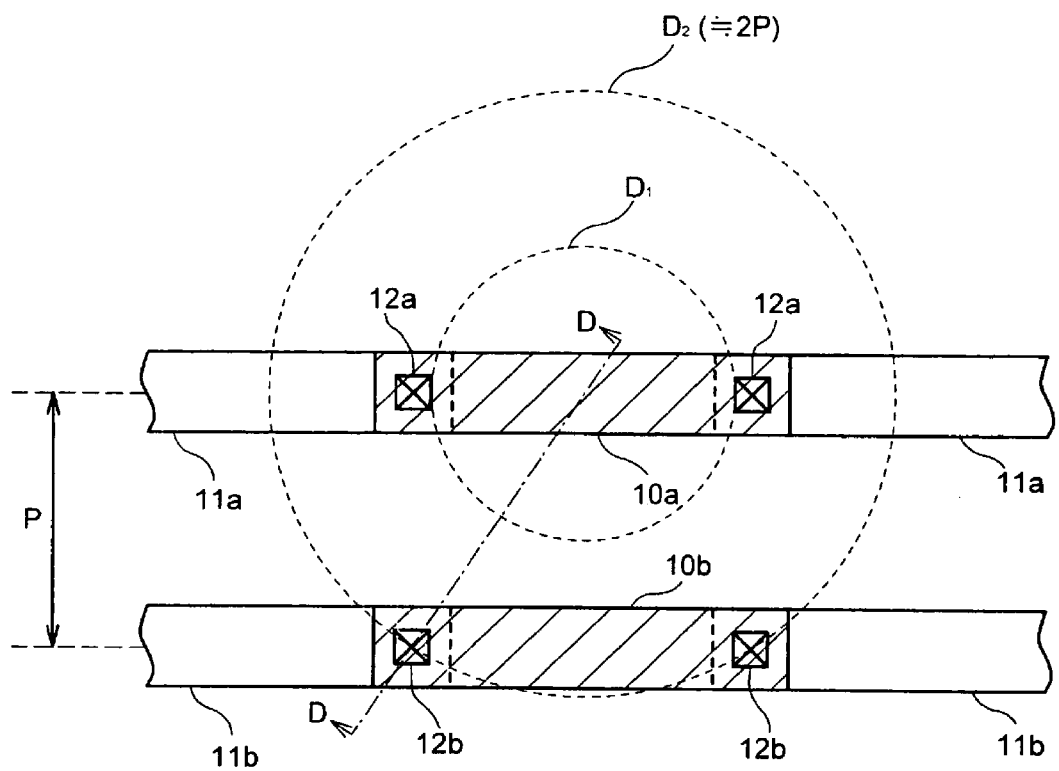
FIG. 12 is a top plan view for explaining the influence applied by the laser beam to other fuse elements and to their peripheries.
Figure 13:
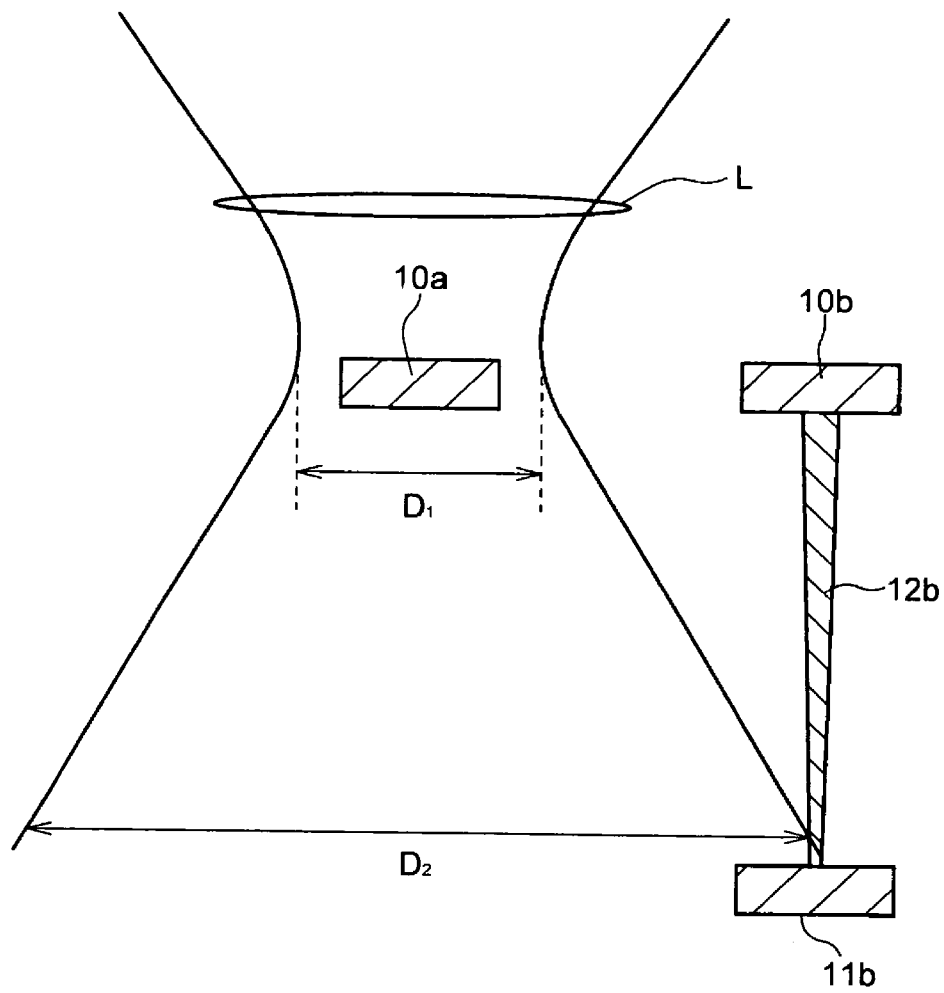
FIG. 13 is a schematic cross-sectional view along a line D-D shown in FIG. 12.

As shown in FIG. 10, intermediate wirings 150 can be provided between the fuse elements 101 to 105 and the lower-layer wirings 111 to 115, respectively. Through-hole electrodes 160 for connecting between the intermediate wirings 150 and the lower-layer wirings 111 to 115 respectively are formed at parts corresponding to the through-hole electrodes 121 to 125. On the other hand, these through-hole electrodes can be omitted at parts corresponding to the attenuation members 140.

In the above embodiment, while the attenuation members 140 use the same material as that of the through-hole electrodes 121 to 125, the material of the attenuation members 140 is not limited to this. Other materials having higher light-absorption rate than that of the insulation film 132 can be also used for the attenuation members 140. Therefore, the material of the attenuation member 140 does not need to be a conductive material, and can be an insulation material having a high light-absorption rate (for example, silicon nitride). When the attenuation members 140 use the same material as that of the through-hole electrodes 121 to 125 like in the above embodiment, the attenuation members 140 and the through-hole electrodes 121 to 125 can be manufactured in the same process, thereby generating no cost increase.

In the above embodiment, while the fuse elements 101 to 105 are laid out in zigzag, the layout of the fuse elements is not limited to this, and can be laid out on a straight-line shape in the X direction or the Y direction. However, when the fuse elements are laid out in zigzag like in the above embodiment, a distance between the fuse elements can be increased while securing high degree of location.

What is claimed is:

1. A semiconductor device comprising:
   a plurality of lower-layer wirings extending in a first direction;
   a plurality of fuse elements that can be disconnected by irradiating a laser beam, the plurality of fuse elements being formed over the plurality of lower-layer wirings;
   a plurality of through-hole electrodes connecting between an end part the plurality of fuse elements and the plurality of lower-layer wirings; and
   attenuation members that can attenuate the laser beam located between the plurality of fuse elements in a second direction perpendicular to the first direction as viewed two-dimensionally,
   wherein the attenuation members comprise a plurality of columnar bodies formed substantially on straight lines connecting between a fuse element in the plurality of fuse elements and the end part of other fuse elements in the plurality of fuse elements which are adjacent to the fuse element.

2. The semiconductor device as claimed in claim 1, further comprising:
   a semiconductor substrate, the plurality of lower-layer wirings being formed over the semiconductor substrate,
   wherein a distance between the attenuation members and the semiconductor substrate is less than a distance between the plurality of fuse elements and the semiconductor substrate.

3. The semiconductor device as claimed in claim 2, wherein the columnar bodies extend in a direction perpendicular to the semiconductor substrate.

4. The semiconductor device as claimed in claim 3, wherein at least a part of the columnar bodies is provided on the same layer as that of the through-hole electrodes.

5. The semiconductor device as claimed in claim 4, wherein the columnar bodies are constituted by the same conductive material as that of the through-hole electrodes.

6. The semiconductor device as claimed in claim 5, wherein the columnar bodies are cylindrical bodies having a cavity therein.

7. The semiconductor device as claimed in claim 5, wherein the columnar bodies are insulated from at least the lower-layer wirings.

8. The semiconductor device as claimed in claim 1, wherein a diameter of each columnar body is smaller than a diameter of each through-hole electrode.

9. The semiconductor device as claimed in claim 3, wherein a diameter of a columnar body in the plurality of columnar bodies is smaller than a wavelength of the laser beam.

10. A semiconductor device comprising:
    a semiconductor substrate;
    a plurality of lower-layer wirings formed over the semiconductor substrate and extending in a first direction;

a plurality of fuse elements that can be disconnected by irradiating a laser beam, the plurality of fuse elements being formed over the plurality of lower-layer wirings;

a plurality of through-hole electrodes connecting between an end part the plurality of fuse elements and the plurality of lower-layer wirings; and attenuation members that can attenuate the laser beam, wherein the attenuation members are located between the plurality of fuse elements in a second direction perpendicular to the first direction as viewed two-dimensionally, wherein a distance between the attenuation members and the semiconductor substrate is less than a distance between the fuse element and the semiconductor substrate, and wherein the attenuation members comprise a plurality of columnar bodies formed substantially on straight lines connecting between a fuse element in the plurality of fuse elements and the end part of other fuse elements in the plurality of fuse elements which are adjacent to the fuse element.

11. The semiconductor device as claimed in claim 10, wherein the plurality of columnar bodies extend in a direction perpendicular to the semiconductor substrate.

12. The semiconductor device as claimed in claim 11, wherein at least a part of the columnar bodies is provided on the same layer as that of the through-hole electrodes.

13. The semiconductor device as claimed in claim 12, wherein the columnar bodies are constituted by the same conductive material as that of the through-hole electrodes.

14. The semiconductor device as claimed in claim 13, wherein the columnar bodies are insulated from at least the lower-layer wirings.

15. The semiconductor device as claimed in claim 13, wherein a diameter of each columnar body is smaller than a diameter of each through-hole electrode.

16. The semiconductor device as claimed in claim 11, wherein a diameter of the columnar body is smaller than a wavelength of the laser beam.

17. A device comprising:
a substrate;
an insulating layer formed over the substrate;
first and second fuse elements formed on the insulating layer adjacently to each other, the first fuse element including a first portion which may be disconnected by irradiating of a laser beam, a first end part and a second end part, the first portion being between the first and second end parts, the second fuse element including a third end part and a fourth end part;

first and second through-hole electrodes formed in the insulating layer, the first through-hole electrode being in contact with the first end part of the first fuse element, the second through-hole electrode being in contact with the second end part of the first fuse element;

third and fourth through-hole electrodes formed in the insulating layer, the third through-hole electrode being in contact with the third end part of the second fuse element, the fourth through-hole electrode being in contact with the fourth end part of the second fuse element; and a first attenuation member comprising columnar body formed in the insulating layer apart from each of the first and second fuse elements and the first, second, third and fourth through-hole electrodes at a position substantially on a first extending line connecting between the first portion of the first fuse element to the third end part of the second fuse element.

18. The device as claimed in claim 17, further comprising a second attenuation member formed in the insulating layer apart from each of the first and second fuse elements and the first, second, third and fourth through-hole electrodes at a position substantially on a second extending line from the first portion of the first fuse element to the fourth end part of the second fuse element.

19. The device as claimed in claim 18, wherein the second fuse element further includes a second portion which may be disconnected by irradiating of the laser, the first attenuation member being further at a position substantially on a third extending line from the second portion of the second fuse element to the first end part of the first fuse element, and the second attenuation member being further at a position substantially on a fourth extending line from the second portion of the second fuse element to the second part of the first fuse element.

* * * * *